United States Patent [19]

Giolma et al.

[11] 4,091,335

[45] May 23, 1978

[54] PHASE LOCKED LOOP USING CURRENT CONTROLLED RING OSCILLATOR

[75] Inventors: William Henry Giolma, Garland; Bernhard Hans Andresen, Dallas, both of Tex.

[73] Assignee: Texas Instruments Incorporated, Dallas, Tex.

[21] Appl. No.: 750,071

[22] Filed: Dec. 13, 1976

[51] Int. Cl.$^2$ .............................. H03B 3/04; H03B 5/02
[52] U.S. Cl. ........................................ 331/1 A; 331/8; 331/25; 331/34; 331/57; 331/108 C
[58] Field of Search ................... 331/1 A, 8, 18, 25, 331/34, 57, 108 C, 108 D

[56] References Cited

U.S. PATENT DOCUMENTS

| | | | |
|---|---|---|---|
| 3,217,267 | 11/1965 | Loposer | 331/1 A X |
| 3,388,340 | 6/1968 | Loughry | 331/57 X |
| 3,931,588 | 1/1976 | Gehweiler | 331/57 |
| 4,004,235 | 1/1977 | Roberts | 331/25 X |

*Primary Examiner*—Siegfried H. Grimm
*Attorney, Agent, or Firm*—James T. Comfort; René E. Grossman; James J. Elacqua

[57] ABSTRACT

A current controlled ring oscillator is utilized in a phase locked loop system. The ring itself is comprised of lateral pnp current sources and Schottky clamped npn transistors to provide a frequency range of 4 megahertz at 50 microamp drive to 43 megahertz at 1 milliamp drive. The frequency of the ring oscillator is varied by varying the current injected into the ring.

12 Claims, 3 Drawing Figures

PHASE LOCKED LOOP USING CURRENT CONTROLLED RING OSCILLATOR

BACKGROUND OF THE INVENTION

This invention relates to a current controlled ring oscillator and its use in phase locked loop (PLL) systems.

Phase locked loop techniques have been known since the early 1930's but had been somewhat avoided because of their high cost and complexity in discrete system design. With the developments in integrated circuit design and processing this situation is rapidly changing and phase locked loops are fast becoming versatile building blocks with many applications.

Basically a phase locked loop is a frequency feedback system comprised of a phase detector, a low-pass filter and a voltage-controlled oscillator (VCO) in the feedback path. When the input signal to the loop is zero the voltage-controlled oscillator operates at a predetermined, free-running frequency. If an input signal is applied, usually by a crystal controlled oscillator, the phase detector compares the phase and frequency of the input signal with the signal of the voltage controlled oscillator and generates an error voltage that is related to the difference in the two signals. The error voltage is then filtered and applied to the control of the VCO thereby varying the VCO frequency in a direction that reduces the frequency difference between the two signals. When the frequencies of the two signals become sufficiently close, the feedback nature of the system causes the system to lock with the incoming signal. Once in lock the VCO frequency is identical with the input signal, except for a finite phase difference which is necessary to generate the corrective error voltage to shift the VCO frequency to the input signal frequency, thus keeping the system in lock.

Used as a building block the phase locked loop is suitable for a wide variety of applications including FM demodulation, frequency synchronization and signal conditioning.

Normally, a PLL has a voltage controlled oscillator which runs off of the low pass filter output. However, to integrate a voltage controlled oscillator using conventional voltage controlled oscillator design requires considerable silicon area on the chip due to the complexity of the circuitry. A further problem found by using voltage controlled oscillators in a PLL is in getting the PLL to lock on the input signal, that is generating the proper error voltage to regulate the voltage controlled oscillator signal output.

SUMMARY OF THE INVENTION

The function of the voltage controlled oscillator in the PLL is to convert a voltage to a frequency, and since phase is the integral of frequency, the voltage controlled oscillator functions as an integrator in the feedback loop. Therefore, the frequency is controlled by varying the voltage fed into the voltage controlled oscillator. In a ring oscillator it is possible to vary the frequency by varying the current injected into the ring. However, the ring oscillator is a much simpler design and uses less area on a silicon chip. A current controlled ring oscillator and a PLL system using this ring oscillator are the subject of the present invention.

A current controlled ring oscillator that is capable of performing in a PLL system comprises a variable current source and a control means to regulate the amount of current injected into the ring. The ring itself is comprised of a series of logic gates, odd in number, connected to the variable current source that causes each logic gate to operate. When operating in unison the logic gates will deliver a time delayed signal having a frequency proportional to the amount of current injected into the ring. The current affects the delay constant in each gate which when added together gives the total period of the signal generated.

In a PLL system the low pass filter which may be of the form of a resistor-capacitor network is connected to the control means of the current controlled ring oscillator and delivers an injection current. The other functions of the PLL system using a current controlled ring oscillator remain the same. An input reference signal is generated by a crystal controlled oscillator and delivered to a phase detector which also receives the output signal of the current controlled ring oscillator and compares the frequency and phase of both signals. The phase detector then generates an error voltage which is delivered to the current controlled ring oscillator after being filtered by the low pass filter network.

The use of a current controlled ring oscillator in an integrated phase locked loop saves space on the chip because of its simple circuit design. The current controlled ring oscillator is readily adaptable to integrated injection logic which adds to the space saving on an integrated circuit in that all of the variable current sources for each logic gate can be replaced by one common current source. Integrated injection logic also allows the use of a multiple collector on the last transistor in the series to facilitate delivering an output signal and a feedback signal without added circuitry.

DETAILED DESCRIPTION OF THE INVENTION

Figure 1:
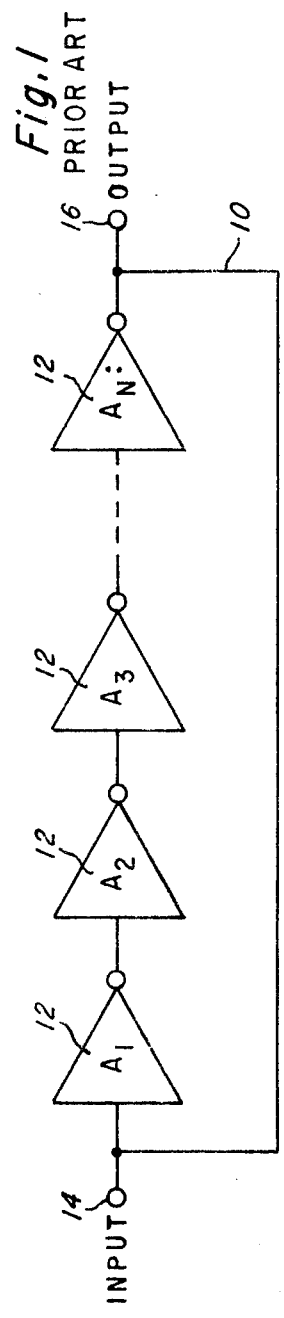
FIG. 1 is a schematic diagram illustrating a standard form of oscillator circuit.

Referring now more particularly to FIG. 1 there is shown a standard oscillator circuit in the form of a simple feedback loop 10 containing an odd number of inverters 12. When a signal is delivered to the input 14 of the feedback loop 10, the inverters 12 change the value of the signal from a high to low or vice versa. When there is present an odd number of inverters 12, the result is an oscillating signal at the output 16.

Each inverter 12 has a propagation delay, which can be defined as the time it takes for the inverter to perform, that being to invert the signal. In the inverters 12, the propagation delay has two possible values, depending on whether the gate is changing from low to high or high to low.

Letting $A_n$ equal the number of gates, where $A_n$ is a positive odd integer, and T equal the propagation delay, which as an approximation can be the average value of the high and low propagation delays for each inverter, the frequency of the signal generated by a system as shown in FIG. 1 can be designated by the formula:

$$\text{Frequency} = \frac{1}{2T(A_n)}$$

Therefore it can be seen that increasing the number of gates will cause more delay and thus lower the frequency of the system.

Figure 2:
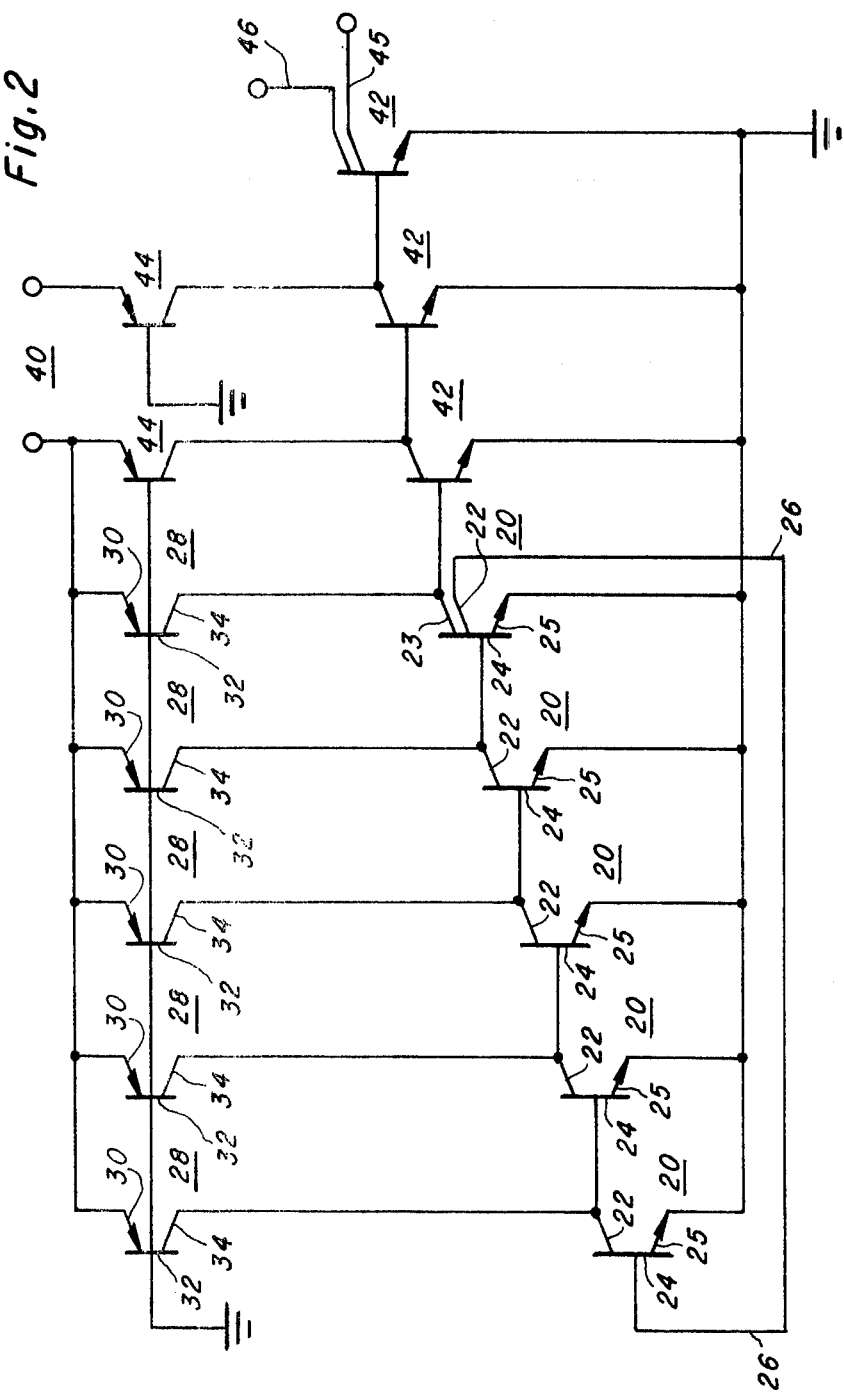
FIG. 2 is a schematic diagram illustrating one embodiment of a current controlled ring oscillator using I²L logic gates constructed in accordance with the present invention.

FIG. 2 is a current controlled ring oscillator that functions on the principles set out in relation to FIG. 1. The circuit logic used in the ring oscillator in FIG. 2 is integrated injection logic (I$^2$L). Currently, several "logic circuit families" are known, and may be divided into those in the unipolar (FET) and bipolar technology. Particularly well known in bipolar technology are RTL (resistor-transistor logic), DTL (diode-transistor logic), TTL (transistor-transistor logic) and ECL (emitter-coupled logic) circuit families. The latest addition to the bipolar family is I$^2$L. Any of the above logic circuit families may be used in construction of the current controlled ring oscillator disclosed herein. However, I$^2$L provides space saving gate layouts that reduce the surface area of the semiconductor substrate needed for integration of the circuit.

In FIG. 2 a plurality of NPN transistors 20 are connected such that the collector 22 of each transistor 20 is connected to the base 24 of the succeeding transistor 20, with the two end transistors 20 being similarly connected to provide a feedback loop 26. The NPN transistors 20 operate as inverters and when energized will perform as the feedback system described in FIG. 1. The NPN transistors 20 are connected to simple PNP transistors 28 which serve as a current source exciting the NPN transistors 20. The emitters 30 and bases 32 of the PNP transistors 28 are common to each other. Each of the collectors 34 of the current source defined by PNP transistors 28, is common to the base 24 of a corresponding NPN transistor 20. The emitters 25 of the NPN transistors 20 are also common to each other and in a diffusion for purposes of integrating are common to the bases 32 of the PNP transistors 28. Thus, when the I$^2$L gate is laid out on the surface of the semiconductor substrate which may be silicon, both circuit elements can be merged and fitted into the area of a single transistor, in the process eliminating completely the space-consuming necessity of device isolation. The emitters 30 of the PNP transistors 28, common for all gates, comprise the injector. On a silicon substrate, the entire gate takes up the room of a single multi-emitter transistor.

Current is delivered over an external transistor (not shown) into the injector rail 40. The total current from the injector is divided equally among the NPN transistors 20. The current is delivered to the NPN transistors 20 by way of the collectors 34 of PNP transistors 28, to some point between any two NPN transistors 20. The speed and frequency of oscillation of the ring oscillator changes nearly proportionately with the current delivered to the injector rail 40 and performs the function of a current controlled oscillator.

A further advantage of I$^2$L logic circuitry is the use of multiple collectors. In this connection, the last NPN transistor 20 in the plurality thereof is provided with a second collector 23 which enables the delivery of the output signal from the plurality of NPN transistors 20 to an output circuit while the first collector 22 in the same transistor delivers the signal to the feedback loop 26.

An amplifier circuit which may comprise a plurality of NPN transistors 42 connected to current sources 44 receives the output signal from the collector 23 of the last NPN transistor 20 and delivers an amplified output signal by way of the multiple collectors 45 and 46.

Figure 3:
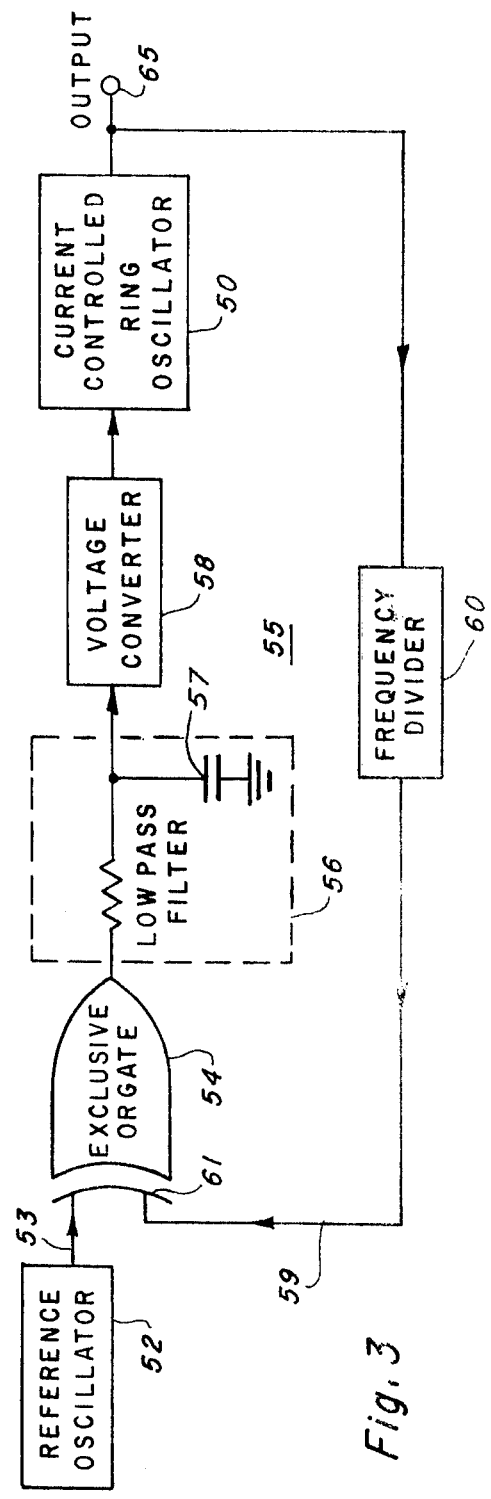
FIG. 3 is a diagram partly in schematic and partly in block form showing a frequency synthesizer using a current controlled ring oscillator constructed in accordance with the present invention.

Referring now to FIG. 3, a phase locked loop system performing as a frequency synthesizer is disclosed in which a current controlled ring oscillator 50 of the type shown in FIG. 2 is included as an integral part thereof.

A reference oscillator 52 in the form of a crystal controlled oscillator as that manufactured by Motorola, Phoenix, Arizona, Model MC 12060 generates an input reference signal 53 that may be of square or sinusoidal waveform. The input reference signal 53 enters the phase locked loop 55 at one of two inputs to a phase detector 54 which may be an exclusive 'OR' logic gate of the type manufactured by Texas Instruments Incorporated of Dallas, Texas, as Model #SN5486. The phase locked loop 55 further includes a low pass filter 56 connected to the output of the phase detector 54 and which may comprise a resistor-capacitor circuit network, for example. The low pass filter 56 is connected to a voltage converter 58 which may take the form of a suitable variable resistor. The current controlled ring oscillator 50 as shown in FIG. 2 for example is connected to the output of the voltage converter 58 and to the input of a frequency divider 60. A suitable frequency divider 60 may be Model SN5493A made by Texas Instruments Incorporated of Dallas, Texas, for example. The frequency divider 60 is disposed in a feedback loop 59 extending from the output of the current controlled ring oscillator to the input of the phase detector 54, the feedback loop 59 being connected to a second input 61 of the phase detector 54.

Operationally, when the input reference signal 53 is zero, the current controlled ring oscillator 50 runs at a predetermined frequency called its free-running frequency. Upon generation of an input reference signal 53, a capacitor 57 in the low pass filter 56, set initially with a zero charge, takes on charge as the phase detector 54 begins to generate an error voltage. The error voltage is then passed through the voltage converter 58 which delivers current to the current controlled ring oscillator 50 causing it to slow down and depart from its free running frequency. The output signal from the current controlled ring oscillator 50 is then passed along the feedback loop 59 through the frequency divider 60 and delivered to the second input 61 of the phase detector 54. The phase detector 54 then compares the phase of the input reference signal 53 and that of the phase locked loop signal from the feedback loop 59 and generates an error voltage proportional to the difference between the two signals. This error voltage follows the same path described above and eventually causes the current controlled ring oscillator 50 to deliver a signal via the feedback loop 59 that when passed through the frequency divider 60 is sufficiently close in phase to the input signal 53 to cause the phase locked loop 55 to reach a lock condition. At some location in the feedback loop 59 between the current controlled ring oscillator 50 and the frequency divider 60, an output tap 65 may be inserted which will receive an output signal from the current controlled ring oscillator 50. When the phase locked loop 55 has reached a lock condition as described herein, this output signal will have a frequency N times greater than the input reference signal 53, where N is the divide-by number in the frequency divider 60.

Although only one embodiment of a current controlled ring oscillator using I$^2$L logic circuits has been shown, it will be understood that other logic circuit families as RTL, DTL, TTL, and ECL, etc. may also be used. The need for low power dissipation, simplicity and small size not only requires integrated circuitry, but also circuit design compatible to integration of which the I²L design herein disclosed is a preferred embodiment only.

We claim:

1. A frequency synthesizer using a phase locked loop system including:
   oscillator means for supplying an input reference signal;
   a closed loop circuit connected to said oscillator means including:
   current controlled ring oscillator means,
   phase detector means disposed between said oscillator means and said current controlled ring oscillator means for comparing the phase of the input reference signal with the phase of the output signal of said current controlled ring oscillator means, and generating an error voltage related to the difference in phase,
   low pass filter means connected to said phase detector means for filtering said error voltage,
   voltage converter means disposed between said low pass filter and said current controlled ring oscillator means for converting said error voltage to a proportional current,
   a system feedback loop from said current controlled ring oscillator means to said phase detector means, and
   frequency divider means disposed in said system feedback loop for increasing the frequency of the output signal of said current controlled ring oscillator means.

2. A frequency synthesizer as set forth in claim 1, wherein said current controlled ring oscillator means comprises:
   logic gate means for generating a time delay signal,
   a feedback loop connected from the output of said logic gate means to the input of said logic gate means,
   injection current means for introducing a control current into said logic gate means, and
   output signal means for delivery of an oscillating signal to said closed loop circuit.

3. A frequency synthesizer as set forth in claim 1, wherein said oscillator means comprises a crystal controlled oscillator.

4. A frequency synthesizer as set forth in claim 1, wherein said phase detector means comprises an exclusive "OR" logic gate.

5. A frequency synthesizer as set forth in claim 1, wherein said low pass filter means comprises a resistor - capacitor network.

6. A frequency synthesizer as set forth in claim 1, wherein said voltage converter means comprises a variable resistor.

7. A current controlled ring oscillator comprising:
   logic gate means for generating a time delay signal,
   a feedback loop connected from the output of said logic gate means to the input of said logic gate means,
   injection current means for introducing a control current into said logic gate means, and
   output signal means connected to said logic gate means for delivery of an oscillating signal.

8. A current controlled ring oscillator as set forth in claim 7, wherein said injection current means and logic gate means comprises integrated injection logic transistor circuitry.

9. A current controlled ring oscillator as set forth in claim 7, wherein said logic gate means comprises a plurality of vertical npn transistors provided as an odd number of said transistors connected one to another such that the collector of each transistor is electrically connected to the base of the succeeding transistor with each base further connected to said injection current means.

10. A current controlled ring oscillator as set forth in claim 9, wherein said injection current means comprises a plurality of lateral pnp transistors corresponding in number to said plurality of vertical npn transistors with said plurality of pnp transistors having common base and emitter elements with each of their respective collectors connected to the base of one of said plurality of vertical npn transistors, said common emitter elements being connected to a terminal for receiving current from an external source.

11. A current controlled ring oscillator as set forth in claim 10, wherein said output signal means comprises the last in said plurality of vertical npn transistors having a second collector extending therefrom for delivering an output signal, with a first collector connected to said feedback loop extending to the base of the first in said plurality of vertical npn transistors, and further including amplifying circuitry connected to said second collector for amplifying said output signal.

12. A current controlled ring oscillator as set forth in claim 7, wherein all of the elements are included in an integrated circuit.

* * * * *